United States Patent [19]

Ramsey et al.

[11] 4,016,511
[45] Apr. 5, 1977

[54] PROGRAMMABLE VARIABLE LENGTH HIGH SPEED DIGITAL DELAY LINE

[75] Inventors: John L. Ramsey, Concord; Allen E. Post, Framingham, both of Mass.

[73] Assignee: The United States of America as represented by the Secretary of the Air Force, Washington, D.C.

[22] Filed: Dec. 19, 1975

[21] Appl. No.: 642,521

[52] U.S. Cl. .................... 333/29; 307/221 R; 333/7 R
[51] Int. Cl.² ............... H03H 7/30; H03H 7/36; H03K 5/153; H03K 5/159
[58] Field of Search ............ 333/29, 7, 7 R, 18, 333/28, 31 R, 30 R; 307/221 R, 221 C, 221 D; 340/173 R

[56] References Cited

UNITED STATES PATENTS

| 3,457,369 | 7/1969 | Davies et al. ............... 333/29 X |
| 3,781,722 | 12/1973 | Pierson ............... 333/31 R |
| 3,790,907 | 2/1974 | Alexander ............... 333/30 R |

*Primary Examiner*—Alfred E. Smith
*Assistant Examiner*—Marvin Nussbaum
*Attorney, Agent, or Firm*—Joseph E. Rusz; William Stepanishen

[57] ABSTRACT

A variable length, digital delay line apparatus utilizing a set of progressively increasing delay devices in conjunction with a set of digitally selectable switching units to vary the delay times over a predetermined delay range.

6 Claims, 2 Drawing Figures

PROGRAMMABLE VARIABLE LENGTH HIGH SPEED DIGITAL DELAY LINE

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to delay lines, and in particular, to a programmable, variable length, high speed, digital delay line apparatus.

In the prior art, the function of electrically controlling a variable delay line was usually accomplished through the use of a variable inductance or a variable capacitance in the delay line. By varying the electrical potential applied to the inductance or capacitance, the amount of delay imposed upon the input signal in the delay line could be increased or decreased as desired. The disadvantage of this technique, however, was that the increment of delay which could be imposed on the input signal as a practical matter was relatively a small fraction of the total delay available in the delay line. A further disadvantage resulting from the use of these techniques was that by varying the inductance or capacitance in the delay circuit, the characteristic impedence of the entire line through which the input signal traveled is changed with the result that it becomes difficult to obtain a final signal with the proper wave form characteristics. Methods to automatically reterminate the line as the characteristic impedance is varied, are complex and expensive. The previous method also suffers from a tendency to couple the control signal into the output signal, thereby corrupting its wave form as the delay is varied.

SUMMARY

The present invention utilizes a set of fixed digital delay devices having progressively larger delay times. A set of switching units interconnects the set of fixed delay devices to provide a programmable, variable length, digital delay line. Only one switch may be interposed between any two selected delay units, thereby minimizing any delay which may be introduced by the switching units. The selected positions of the switching units are controlled by a digital decoder, thereby providing a variable length digitally-controlled digital delay line.

It is one object of the present invention, therefore, to provide an improved variable length, digital delay line apparatus having a set of progressively larger delay times.

It is yet another object of the invention to provide an improved variable length digital delay line apparatus wherein the delay introduced by the switching medium is reduced to a minimum.

It is still a further object of the invention to provide an improved variable length digital delay line apparatus wherein the digital delay line length is programmably variable by a digital decoder.

These and other advantages, features and objects of the invention will become more apparent from the following description taken in connection with the illustrative embodiments in the accompanying drawings.

DESCRIPTION OF THE PREFERRED EMBODIMENT

Figure 1:
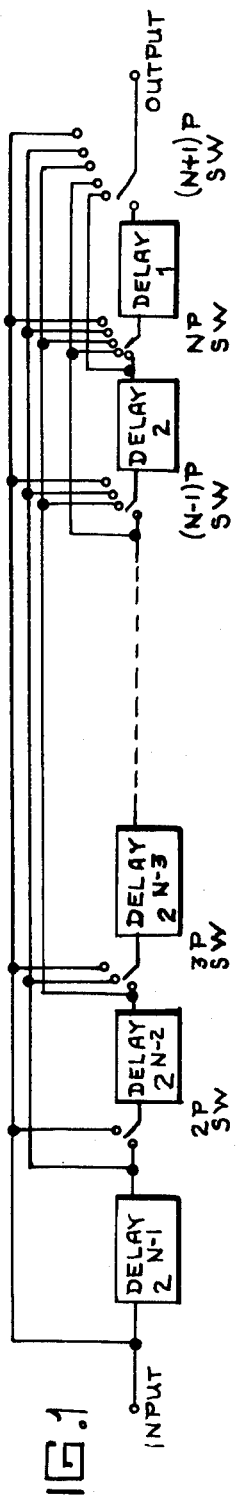
FIG. 1 is a block diagram of the variable length, digital delay line apparatus in accordance with the present invention, and, FIG. 2 is a detailed block diagram illustrating the digitally programmable, variable length, digital delay line apparatus.

Referring now to FIG. 1, there is shown in block diagram of the variable length, digital delay line apparatus having a set of digital delay units, 1 through $2^{N-1}$ to provide a predetermined digital delay time. The digital delay line apparatus apparatus utilizes itilizes a set of N switches, where N is a positive integer greater than zero and N fixed-length digital delay lines 0 to $2^{N-1}$ units. If the maximum switching times are $t_S$ for the switch with greatest time delay and $t_D$ for the slowest delay line, then the delay line apparatus can operate at a maximum rate of $1/(t_s t_n)$.

The delay line apparatus comprises a set of N fixed length digital delay lines having digital delay times of 1, 2, 4, . . . , $2^{n-2}$, $2^{N-1}$ units, and a set of N switches having 2, 3, 4 . . . , N, N+1 positions. The input to the digital delay of $2^i$ units is connected to the output of the switch having N−i positions, where $i = 0, 1, . . . , N-2$. The input to the digital delay of $2^{N-1}$ units is connected to the input of the device, and the output of the device is connected to the output of the switch having N+1 positions.

Figure 2:
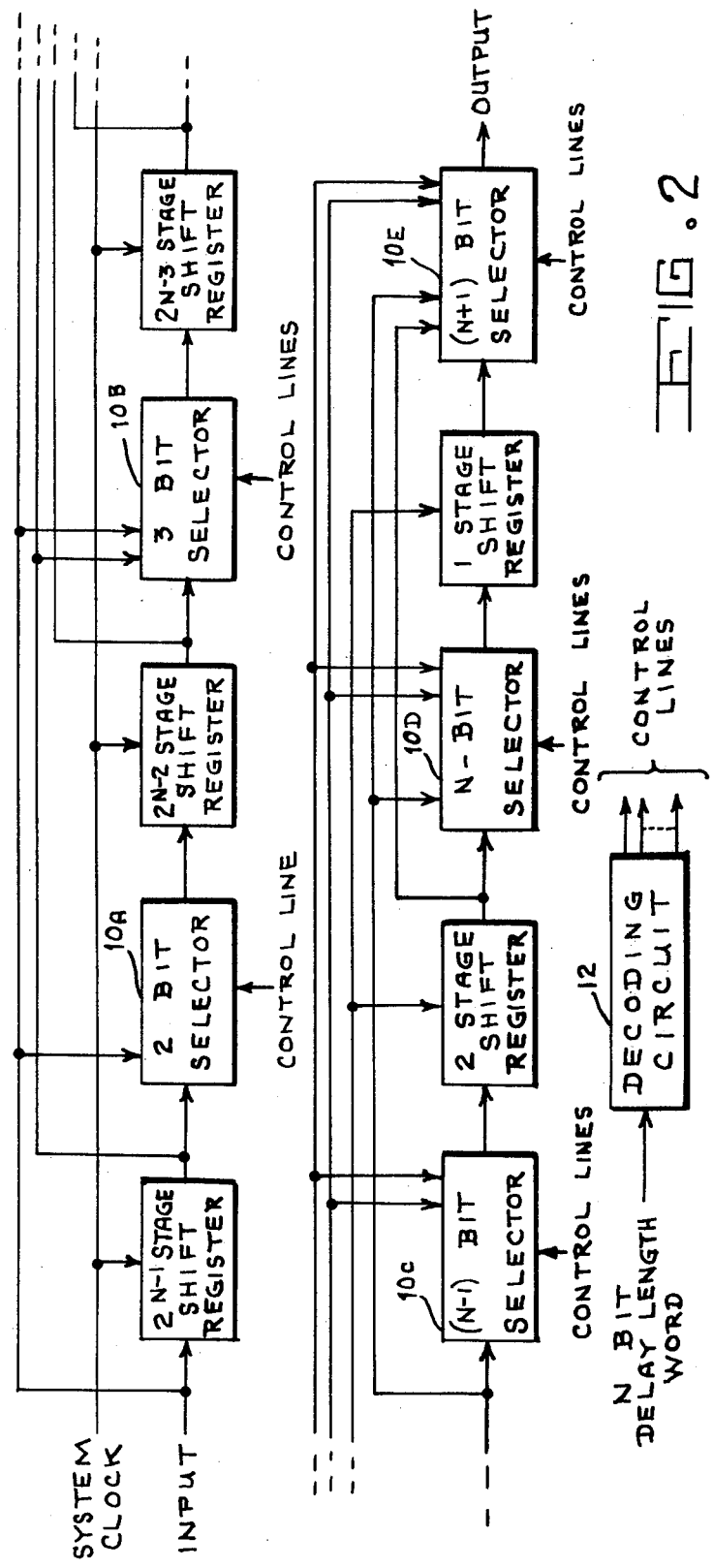

Turning now to FIG. 2, there is shown a detailed block diagram of the variable length, fast-carry, digital delay line apparatus utilizing integrated solid state selector circuits 10 A–E to serve as switches. These switches 10 A–E are controlled by a decoding circuit 12 that transforms the n-bit length specification into the various switch selection signals.

One of the basic requirements of the present variable length digital delay line apparatus is that of clock speed. The fastest possible clock rate is the reciprocal of the longest time it takes a bit of data to be transferred from one stage in the shift register to the next. In order to reduce the delay time which is introduced by switches (selectors), the present variable length digital delay line apparatus is arranged so that only one switch can be interposed between two selected sections of digital delay line. Therefore, the switch preceding any section of the digital delay line must contain the proper amount of switch positions to select the output of any one of the preceding stages.

This point may be best illustrated by the following example, wherein it is assumed that the programmable delay line has a total potential length of 1023 ($=2^{10}-1$) and is programmed to provide a delay of 612 (=1001100100) clock periods. Assuming that there are 10 available sections of delay, the units having lengths of 512 ($=2^9$), 64 ($=2^6$), 32 ($=2^5$), and 4 ($=2^2$) shall be needed. The decoding circuit sends out control signals such that (1) the 11-position ((N+1)-Bit) output switch selects the output of the four-stage shift register, 2 the eight-position switch preceding the four-stage shift register selects the output of the 32-stage shift register, 3 the five-position switch preceding the 32-stage shift register selects the output of the 64-stage shift register, and 4 the four-position switch preceding the 64-stage shift register selects the output of the 512- stage shift register. The status of the six remaining switches is not important since they do not lie in the path of the bit stream that results from the switch positions selected. Thus, it may be seen that the desired digital delay length has been provided by digital means.

Although the invention has been described with reference to a particular embodiment, it will be understood to those skilled in the art that the invention is capable of a variety of alternative embodiments within the spirit and scope of the appended claims.

What is claimed is:

1. A variable length, high speed, digital delay line apparatus comprising in combination:
    a set of serially arranged, fixed-length, digital delay units, and
    a set of switching units interposed respectively between each of said set of delay units, said set of switching units having a set of switching position, said set of switching positions being one greater than the rank of the switching unit position within the delay unit chain, each switching position of said set of switching units being connected to a switching position within a switching unit of greater rank, each of said set of switching units being respectively selectable.

2. A variable length, high speed, digital delay line apparatus as described in claim 1 further including digital decoding means for selecting one of said set of switching units, said digital decoding means being interconnected with each of said set of switching units.

3. A variable length, high speed, digital delay line apparatus as described in claim 1 wherein said set of digital delay units comprise in combination:
    a set of shift registers having a geometrically increasing varying number of binary stages.

4. A variable length, high speed, digital delay line apparatus as described in claim 1 wherein said set of switching units comprise in combination:
    a set of binary selector units, each respectively having a progressively increasing number of digital selector bits therein, said selector positions varying between 2 and $N-1$, where N is any positive integer greater than 0.

5. A variable length, high speed, digital delay line apparatus as described in claim 2 wherein said digital selecting means comprises in combination:
    a binary decoding circuit to receive an N-bit delay length word, said binary decoding circuit decoding said N-bit delay length word to activate the proper switching units of said set of switching units to provide the desired delay time.

6. A variable length, high speed, digital delay line apparatus as described in claim 3 wherein said number of binary stages varies between one and $2N^{-1}$, wherein N is any positive integer greater than 0.

* * * * *

UNITED STATES PATENT AND TRADEMARK OFFICE
CERTIFICATE OF CORRECTION

PATENT NO. : 4,016,511
DATED : April 5, 1977
INVENTOR(S) : John L. Ramsey et al

It is certified that error appears in the above-identified patent and that said Letters Patent are hereby corrected as shown below:

Claim 4 line 7 change "N-1" to --N+1--

Claim 6 line 3 change "$2N^{-1}$" to --$2^N -1$--

Signed and Sealed this

Thirteenth Day of January 1981

[SEAL]

Attest:

SIDNEY A. DIAMOND

Attesting Officer

Commissioner of Patents and Trademarks